United States Patent
Wang et al.

(10) Patent No.: US 11,681,087 B2
(45) Date of Patent: Jun. 20, 2023

(54) LIGHT SOURCE MODULE INCLUDING PENETRATING LIGHT SELECTION LAYER

(71) Applicant: Coretronic Corporation, Hsin-Chu (TW)

(72) Inventors: Wen-Chun Wang, Hsin-Chu (TW); Chih-Jen Tsang, Hsin-Chu (TW); Chung-Wei Huang, Hsin-Chu (TW)

(73) Assignee: Coretronic Corporation, Hsin-Chu (TW)

( * ) Notice: Subject to any disclaimer, the term of this patent is extended or adjusted under 35 U.S.C. 154(b) by 0 days.

(21) Appl. No.: 17/727,821

(22) Filed: Apr. 25, 2022

(65) Prior Publication Data

US 2022/0373162 A1    Nov. 24, 2022

(30) Foreign Application Priority Data

May 20, 2021    (CN) .......................... 202121089572.3

(51) Int. Cl.
*G02F 1/13357*    (2006.01)
*F21V 9/40*    (2018.01)
(Continued)

(52) U.S. Cl.
CPC .................. *F21V 9/40* (2018.02); *F21V 9/32* (2018.02); *G02B 6/0055* (2013.01)

(58) Field of Classification Search
CPC .................. G02B 5/28; G02F 1/133607; G02F 1/133609; G02F 1/133611; G02F 1/133614

See application file for complete search history.

(56) References Cited

U.S. PATENT DOCUMENTS

2006/0262555 A1*  11/2006  Yi ..................... G02F 1/133606
                                                              362/23.19
2008/0013323 A1*   1/2008  Katsumoto .......... G02B 6/0053
                                                              362/311.06
(Continued)

FOREIGN PATENT DOCUMENTS

CN     109654404         4/2019
TW     201636700        10/2016
TW     M604898 U    * 12/2022    ........ G02F 1/133611

OTHER PUBLICATIONS

English Translation of TW M6404898 U (Year: 2020).*

*Primary Examiner* — Keith G. Delahoussaye
(74) *Attorney, Agent, or Firm* — JCIPRNET

(57) ABSTRACT

A light source module includes at least one light-emitting element, a first optical layer, a penetrating light selection layer, a second optical layer, a light splitting layer, and a wavelength conversion layer. The light-emitting element is configured to provide a beam with a wavelength falling within a first wavelength band. An exit angle at which the beam exits the first optical layer is greater than an incident angle at which the beam is incident to the first optical layer. The penetrating light selection layer may allow light with a wavelength falls within a second wavelength band to pass through and has corresponding transmittance for light with a wavelength falling within the first wavelength band and is incident at different incident angles. An exit angle at which the beam exits the second optical layer is less than an incident angle at which the beam is incident to the second optical layer.

10 Claims, 6 Drawing Sheets

(51) Int. Cl.
*F21V 8/00* (2006.01)
*F21V 9/32* (2018.01)

(56) References Cited

U.S. PATENT DOCUMENTS

| | | | |
|---|---|---|---|
| 2013/0016312 A1* | 1/2013 | Kim | G02F 1/137 349/97 |
| 2016/0070137 A1* | 3/2016 | You | G02F 1/133609 349/71 |
| 2019/0195469 A1 | 6/2019 | Yamada | |
| 2020/0285112 A1* | 9/2020 | Miyata | G02F 1/133605 |

* cited by examiner

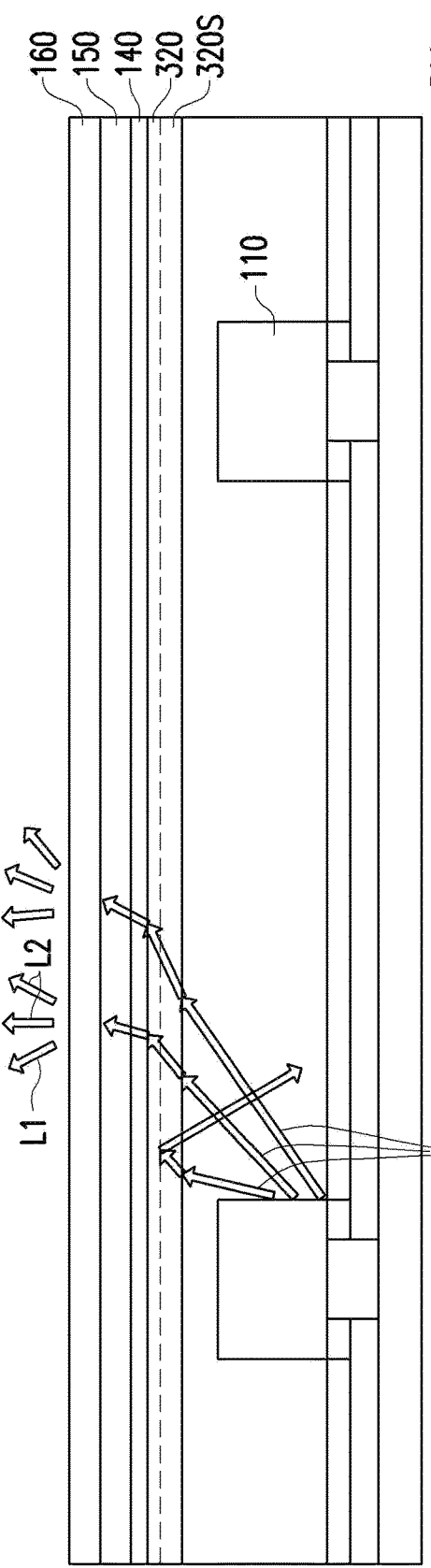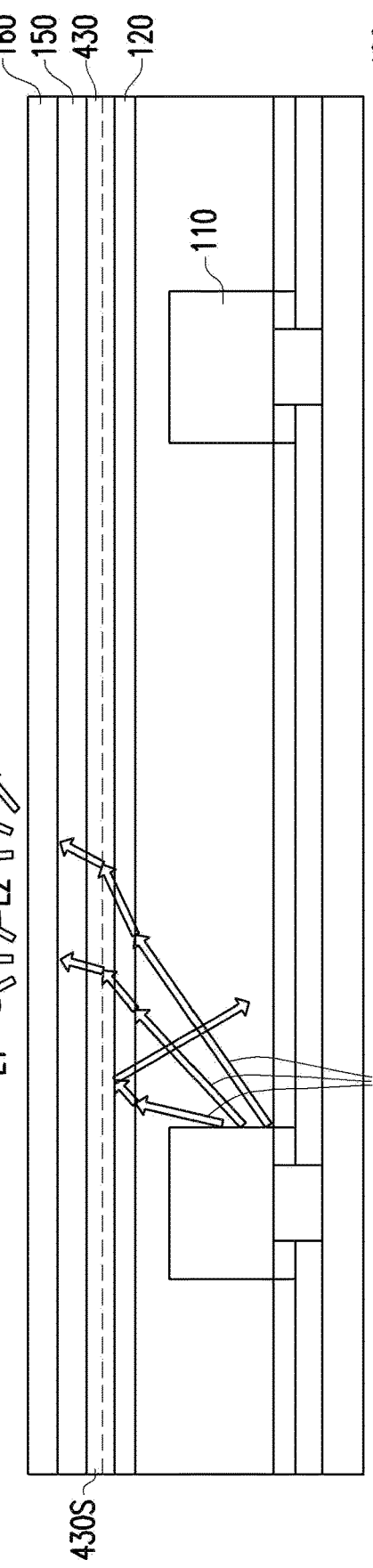

LIGHT SOURCE MODULE INCLUDING PENETRATING LIGHT SELECTION LAYER

CROSS-REFERENCE TO RELATED APPLICATION

This application claims the priority benefit of China application serial no. 202121089572.3, filed on May 20, 2021. The entirety of the above-mentioned patent application is hereby incorporated by reference herein and made a part of this specification.

BACKGROUND

Technology Field

The disclosure relates to an optical module, and particularly, to a light source module.

Description of Related Art

Generally speaking, direct type backlight modules applied to flat-panel displays are two-dimensional arrangement of light-emitting diodes disposed on a back plate of a backlight module. With the light type of the light-emitting diode in combination with an optical film and an optical sheet, the light emits from a light-emitting surface of the backlight module uniformly, and at present MINI-LED backlight modules are also an implementation of the direct type backlight module.

Generally speaking, in a direct type backlight module, an optical distance (OD) is required between a light source and an optical film. As the optical distance gets longer, a larger spot may be projected on the optical film. Therefore, in a backlight module with the same area and the same uniformity, the number of light-emitting diodes used by the backlight module with a longer optical distance may be relatively small, and its cost is relatively low. However, the optical distance is positively related to the backlight module thickness. Backlight module with longer optical distance may not be used in thick-sensitive products (e.g., mobile phones, tablet computers, notebook computers, and the like). Therefore, in thick-sensitive products, often more optical films are required, and the number of light-emitting diodes is increased, so as to improve the light uniformity of the backlight module. By doing so, however, there may be an increase in cost, and the thickness of the stack formed by the optical film may not be effectively reduced. In addition, when the number of light-emitting diodes is increased, the yield rate of the backlight module is reduced (e.g., cause by mounting the light-emitting diodes).

In addition, to solve the problem of the excessive number of light-emitting diodes, a direct type backlight module with light-emitting diodes (including a Mini-LED) and light guide slopes is proposed, but this backlight module requires light-guiding side walls and the like, which may not effectively reduce the module thickness, and meanwhile there is also a problem of alignment between the reflective surface and the light-emitting diode.

The information disclosed in this Background section is only for enhancement of understanding of the background of the described technology and therefore it may contain information that does not form the prior art that is already known to a person of ordinary skill in the art. Further, the information disclosed in the Background section does not mean that one or more problems to be resolved by one or more embodiments of the disclosure was acknowledged by a person of ordinary skill in the art.

SUMMARY

The disclosure provides a light source module, which is capable of providing a beam with good uniformity and has a small optical distance and low cost.

Other objectives, features and advantages of the present disclosure may be further understood from the technological features disclosed by the disclosure.

In order to achieve one, some, or all of the above objectives, an embodiment of the disclosure provides a light source module. The light source module includes at least one light-emitting element, a first optical layer, a penetrating light selection layer, a second optical layer, a light splitting layer, and a wavelength conversion layer. The at least one light-emitting element for providing a beam. A wavelength of the beam falls within a first wavelength band. The first optical layer is disposed on a transmission path of the beam. An exit angle of the beam at which the beam exits the first optical layer is greater than an incident angle of the beam at which the beam is incident to the first optical layer. The penetrating light selection layer is disposed on the transmission path of the beam. The penetrating light selection layer allows light with a wavelength falling within a second wavelength band to pass through, and the penetrating light selection layer has corresponding transmittance for light with a wavelength falling within the first wavelength band and is incident at different angles. The second optical layer is disposed on the transmission path of the beam. The penetrating light selection layer is disposed between the first optical layer and the second optical layer, and when the beam is incident to the second optical layer, an exit angle of the beam at which the beam exits the second optical layer is less than an incident angle of the beam at which the beam is incident to the second optical layer. The light splitting layer is disposed on the transmission path of the beam. The light splitting layer allows light with a wavelength falling within the first wavelength band to pass through and reflects light with a wavelength falling within the second wavelength band. The wavelength conversion layer is disposed on the transmission path of the beam and configured to convert part of the beam into a converted beam, and a wavelength of the converted beam falls within the second wavelength band.

In summary, the embodiments of the disclosure have at least one of the following advantages or effects. In the embodiments of the disclosure, with the configuration of the first optical layer, the penetrating light selection layer, and the second optical layer, the light source module may allow beams radiated at the forward viewing angle and at the small angle by the light-emitting element to travel in a longer transmission path in the cavity of the light source module. Accordingly, the uniformity of the illumination beam may be improved, and therefore the distance of the light-emitting elements may be increased and the optical distance of the light source module may be reduced, so as to reduce the module thickness and the product cost. Moreover, with the configuration of the light splitting layer, the brightness of the illumination beam of the light source module may be increased.

Other objectives, features and advantages of the present disclosure may be further understood from the further technological features disclosed by the embodiments of the disclosure wherein there are shown and described preferred embodiments of this disclosure, simply by way of illustration of modes best suited to carry out the disclosure.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

FIG. 3 is a schematic cross-sectional view of another light source module according to an embodiment of the disclosure.

FIG. 4 is a schematic cross-sectional view of still another light source module according to an embodiment of the disclosure.

DESCRIPTION OF THE EMBODIMENTS

In the following detailed description of the preferred embodiments, reference is made to the accompanying drawings which form a part hereof, and in which are shown by way of illustration specific embodiments in which the disclosure may be practiced. In this regard, directional terminology, such as "top," "bottom," "front," "back," etc., is used with reference to the orientation of the FIG.(s) being described. The components of the disclosure may be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the disclosure. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A "Component is directly "adjacent to" "B" component or one or more additional components are between "A" component and "B" component. Accordingly, the drawings and descriptions may be regarded as illustrative in nature and not as restrictive.

Figure 1A:
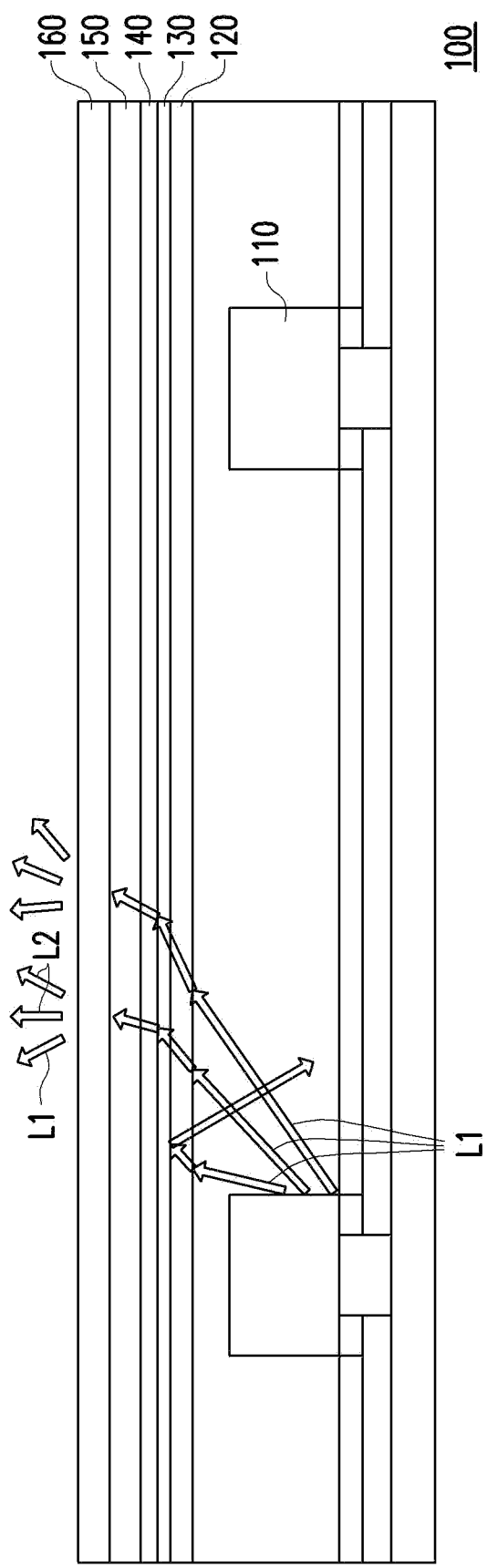
FIG. 1A is a schematic cross-sectional view of a light source module according to an embodiment of the disclosure.
Figure 1B:
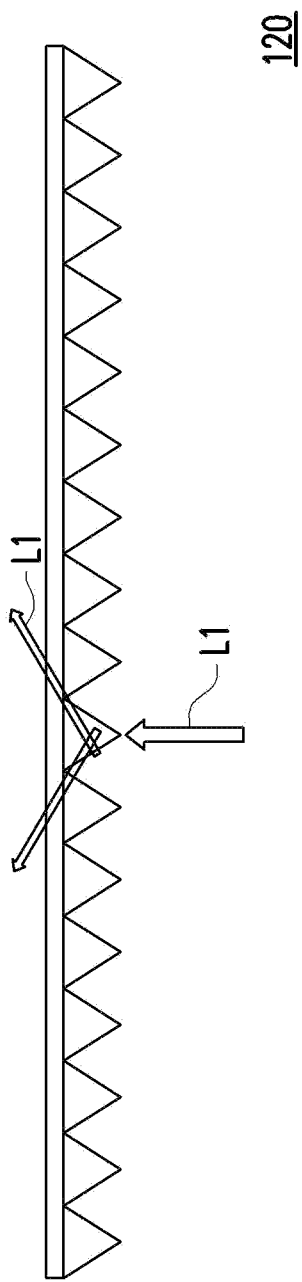
FIG. 1B is a schematic cross-sectional view of a first optical layer of FIG. 1A.
Figure 1C:
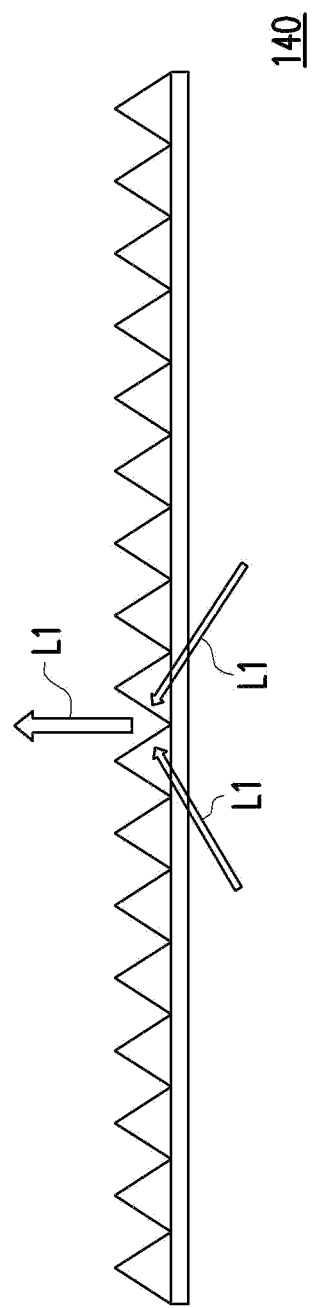
FIG. 1C is a schematic cross-sectional view of a second optical layer of FIG. 1A.

FIG. 1A is a schematic cross-sectional view of a light source module according to an embodiment of the disclosure. FIG. 1B is a schematic cross-sectional view of a first optical layer of FIG. 1A. FIG. 1C is a schematic cross-sectional view of a second optical layer of FIG. 1A. Referring to FIG. 1A to FIG. 1C, in the embodiment, a light source module 100 includes at least one light-emitting element 110, a first optical layer 120, a penetrating light selection layer 130, a second optical layer 140, a light splitting layer 150, and a wavelength conversion layer 160. In the embodiment, the light source module 100 is a direct type backlight module. For example, the light-emitting element 110 may include light-emitting elements, such as a light-emitting diode (LED), a sub-millimeter light-emitting diode (mini LED), or a micro light-emitting diode (micro LED), and the like; and the light-emitting element 110 may be configured to provide a beam L1. In addition, at least one light-emitting element 110 may be disposed on a circuit board (e.g., printed circuit board) with white ink of high reflectivity, the reflectivity of the white ink is greater than 50%, preferably 90%, and the white ink may be configured to reflect a light beam (not shown) transmitted in a direction away from a light-emitting surface to a direction toward the light-emitting surface. Furthermore, in the embodiment, the wavelength of the beam L1 falls within a first wavelength band, and the first wavelength band is a wavelength band ranging from 380 nm to 500 nm, for example. That is, in the embodiment, the beam L1 is blue light, the beam L1 provided by the light-emitting element 110 has a large viewing angle range, a peak of a light distribution pattern of the light-emitting element 110 ranges from 30 degrees to 90 degrees, preferably from 40 degrees to 60 degrees, and the light distribution pattern is bat-wing shaped, for example. However, the disclosure is not limited thereto.

Specifically, as shown in FIG. 1A, the first optical layer 120, the penetrating light selection layer 130, the second optical layer 140, and the light splitting layer 150 are disposed on a transmission path of the beam L1. For example, as shown in FIG. 1B and FIG. 1C, in the embodiment, the first optical layer 120 have multiple optical microstructures arranged in an array and the second optical layer 140 have multiple optical microstructures arranged in an array, and each optical microstructure is polyhedral (e.g., a tetrahedral) and may be configured to adjust a transmission direction of the beam L1, but the disclosure is not limited thereto. In other embodiments, the first optical layer 120 and the second optical layer 140 may also be prism films.

Furthermore, the apex angle of the optical microstructure of the first optical layer 120 ranges from 60 degrees to 150 degrees, preferably less than 90 degrees. In addition, the apex angle of the optical microstructure of the first optical layer 120 is disposed facing the beam L1 (e.g., the optical microstructure of the first optical layer 120 is disposed on a side of the first optical layer 120 facing the light-emitting element 110, and the apex angle faces the light-emitting element 110). Accordingly, as shown in FIG. 1A and FIG. 1B, the exit angle of the beam L1 at which the beam L1 exits the first optical layer 120 is greater than the incident angle of the beam L1 at which the beam L1 is incident to the first optical layer 120, and under a specific incident condition of the beam L1, it is appropriate to split the beam L1. In contrast, as shown in FIG. 1C, the apex angle of the optical microstructure of the second optical layer 140 ranges from 60 degrees to 150 degrees, preferably less than 90 degrees. However, the apex angle of the optical microstructure of the second optical layer 140 is disposed facing a direction away from the beam L1 (e.g., the optical microstructure of the second optical layer 140 is disposed on a side of the second optical layer 140 away from the light-emitting element 110 and the apex angle faces a direction opposite to and away from the light-emitting element 110). Accordingly, as shown in FIG. 1A and FIG. 1C, when the beam L1 is incident to the second optical layer 140, the exit angle of the beam L1 at which the beam L1 exits the second optical layer 140 is less than the incident angle of the beam L1 at which the beam L1 is incident to the second optical layer 140.

Figure 2A:
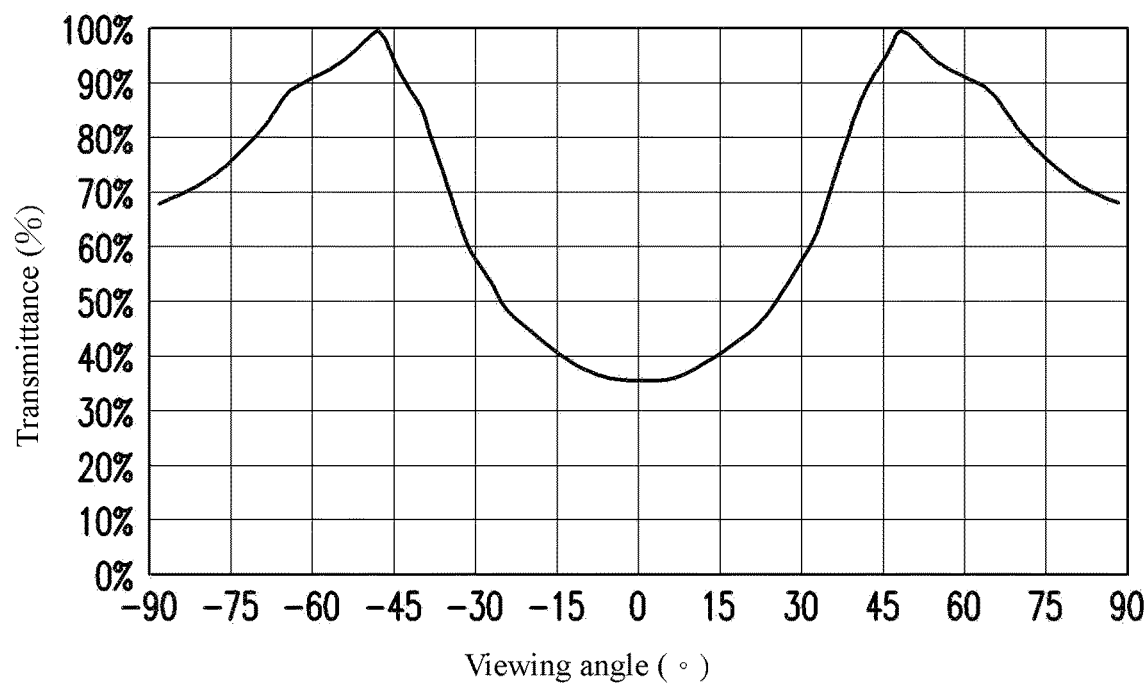
FIG. 2A illustrates a relationship between a light incident angle and transmittance when light with a wavelength falling within a first wavelength band is incident to a penetrating light selection layer of FIG. 1A.
Figure 2B:
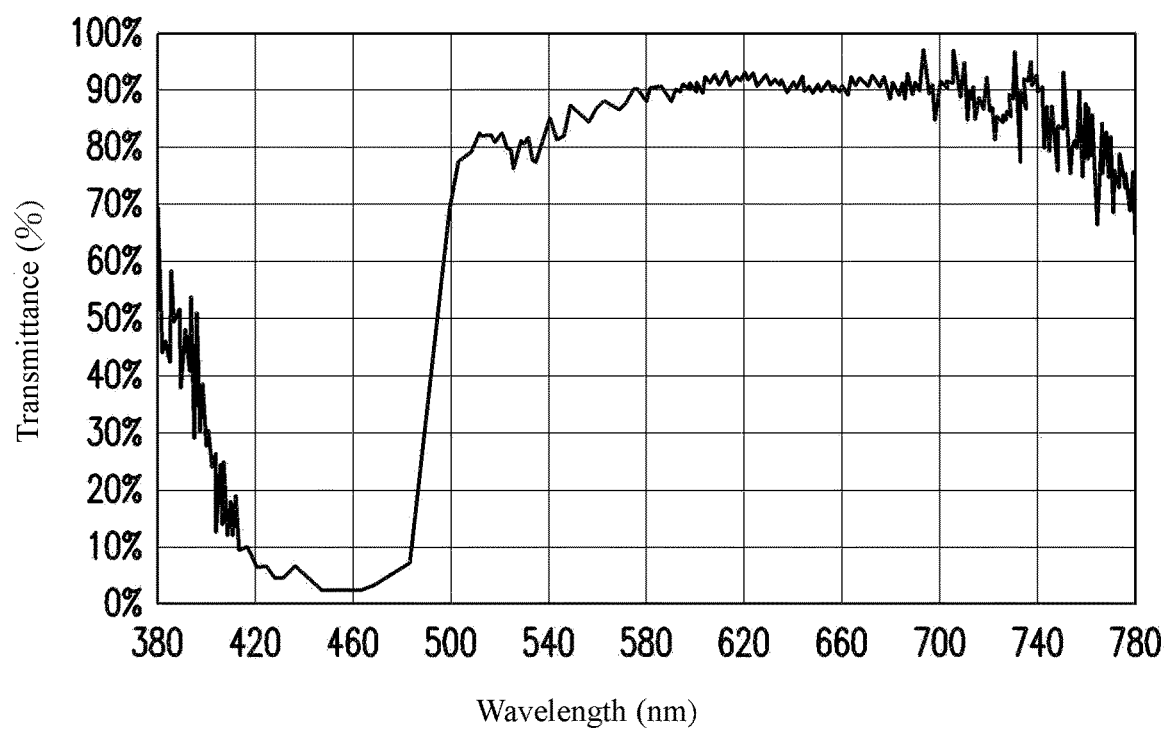
FIG. 2B illustrates a relationship between a wavelength and transmittance when the light of the light source module of FIG. 1A is incident at a forward viewing angle.
Figure 2C:
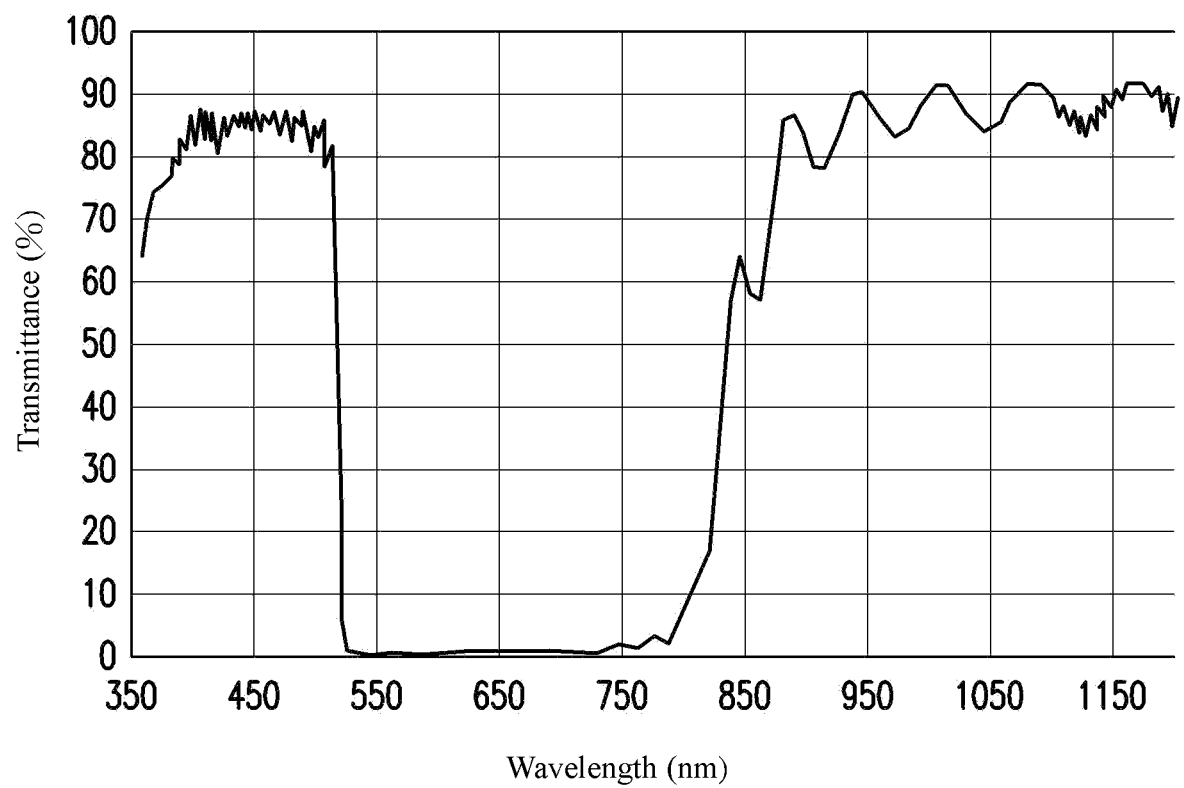
FIG. 2C illustrates a relationship between a wavelength and transmittance when light is incident to a light splitting layer of FIG. 1A.

FIG. 2A illustrates a relationship between a light incident angle and transmittance when light with a wavelength falling within the first wavelength band is incident to a penetrating light selection layer of FIG. 1A. FIG. 2B illustrates a relationship between a wavelength and transmittance when the light of the light source module of FIG. 1A is incident at a forward viewing angle. FIG. 2C illustrates a relationship between a wavelength and transmittance when light is incident to a light splitting layer of FIG. 1A. Referring to FIG. 1A, FIG. 2A to FIG. 2C, in the embodiment, the penetrating light selection layer 130 is disposed between the first optical layer 120 and the second optical layer 140, and the penetrating light selection layer 130 may allow light with a wavelength falling within a second wavelength band to pass through. For example, in the embodiment, the second wavelength band is a wavelength band ranging from 500 nm to 780 nm, for example. In addition, as shown in FIG. 2A, the penetrating light selection layer 130 has corresponding transmittance for light with a wavelength falling within the first wavelength band and incident at different incident angles. In the embodiment, in the penetrating light selection layer 130, a transmittance distribution curve of light with a wavelength falling within the first wavelength band at an incident angle is formed, the transmittance distribution curve of light at an incident angle has at least one transmittance peak (e.g., two transmittance peaks), at least one transmittance peak corresponds to at least one first incident angle one to one, and the at least one first incident angle ranges from 30 degrees to 90 degrees, preferably from 40 degrees to 60 degrees. Furthermore, as shown in FIG. 2A and FIG. 2B, in the embodiment, the penetrating light selection layer 130 has transmittance less than 40% for light with a wavelength falling within the first wavelength band and incident in a forward direction.

Accordingly, the beams L1 emitted by the light-emitting element 110 at the forward viewing angle (e.g., 0 degree) and at a small angle (e.g., 0 degree to 10 degrees) may first be adjusted to a larger angle (e.g., 5 degrees to 40 degrees) through the first optical layer 120 and subsequently selected by the penetrating light selection layer 130, part of the beam L1 may pass through the penetrating light selection layer 130 according to different light incident angles, and another part of the beam L1 may be reflected downward and incident to the cavity (e.g., the space between the light-emitting element 110 and the first optical layer 120) of the light source module 100 by the penetrating light selection layer 130. These beams L1 reflected by the penetrating light selection layer 130 may be diffusely reflected when hitting the white ink on the circuit board. The diffusely reflected beam L1 has an angular distribution and is again transmitted to the first optical layer 120 and the penetrating light selection layer 130. Accordingly, the beam L1 repeats the process in the cavity of the light source module 100, and the beams L1 emitted by the light-emitting element 110 at the forward viewing angle and at the small angle travel in a longer transmission path in the cavity of the light source module 100.

On the other hand, the beam L1 emitted at a large angle (e.g., 10 degrees to 30 degrees, or greater than 30 degrees) by the light-emitting element 110 may be adjusted to a larger angle range (e.g., 40 degrees to 60 degrees, or more than greater than 60 degrees) after passing through the first optical layer 120 and is subsequently incident to the penetrating light selection layer 130. Moreover, most beams L1 may pass through the penetrating light selection layer 130 and are incident to the second optical layer 140, and therefore the beam L1 passing through the second optical layer 140 may be adjusted to a forward viewing angle and transmitted to the light splitting layer 150 and the wavelength conversion layer 160.

Moreover, in the embodiment, the light splitting layer 150 is disposed between the wavelength conversion layer 160 and the second optical layer 140, the second optical layer 140 is disposed between the light splitting layer 150 and the penetrating light selection layer 130. Moreover, as shown in FIG. 2C, in the embodiment, the light splitting layer 150 may allow light with a wavelength falling within the first wavelength band (e.g., the wavelength band ranges from 380 nm to 500 nm) to pass through, and the light splitting layer 150 may reflect light with a wavelength falling within the second wavelength band (e.g., the wavelength band ranges from 550 nm to 780 nm). That is, in the embodiment, the light splitting layer 150 is a light splitting mirror that may reflect red light and green light and allow blue light to pass through. On the other hand, the wavelength conversion layer 160 is disposed on the transmission path of the beam L1 and configured to convert part of the beam L1 into converted beams L2, and the wavelength of the converted beam L2 falls within the second wavelength band. That is, in the embodiment, the converted beam L2 is red light and green light.

Accordingly, part of the beam L1 passing through the first optical layer 120, the penetrating light selection layer 130, and the second optical layer 140 are adjusted to a forward viewing angle. After the beams L1 pass through the light splitting layer 150, the wavelength conversion layer 160 is excited by the beams L1 to generate the converted beam L2, which may be used as the red light and the green light of the illumination beam provided by the light source module 100. In addition, another part of the beam L1 passing through the first optical layer 120, the penetrating light selection layer 130, the second optical layer 140 may be used as the blue light of the illumination beam provided by the light source module 100 and may be mixed with the converted beam L2 to form white light, and thereby being configured to provide a uniform illumination beam. Moreover, the converted beam L2 is transmitted in a random direction, and part of the converted beam L2 transmitted downward may be reflected by the light splitting layer 150, so the brightness of the illumination beam provided by the optical module may be increased accordingly.

Accordingly, with the configuration of the first optical layer 120, the penetrating light selection layer 130, and the second optical layer 140, the light source module 100 may allow the beams L1 emitted at the forward viewing angle and at the small angle by the light-emitting element 110 to travel in a longer transmission path in the cavity of light source module 100, thereby the uniformity of the illumination beam is improved, and therefore the distance between the light-emitting elements 110 may be increased and the optical distance required by the light source module 100 may be reduced, so as to reduce the module thickness and the product cost. Moreover, with the configuration of the light splitting layer 150, the brightness of the illumination beam of the light source module 100 may be increased.

Moreover, note that in the embodiment, the first optical layer 120, the second optical layer 140, and the penetrating light selection layer 130 are different film layers separated from each other, but the disclosure is not limited thereto. In other embodiments, at least one of the first optical layer 120 and the second optical layer 140 may be a surface structure layer of the penetrating light selection layer 130 and formed integrally with the penetrating light selection layer 130. With reference to FIG. 3 and FIG. 4, a further illustration is provided as follows.

FIG. 3 is a schematic cross-sectional view of a light source module according to an embodiment of the disclosure. Referring to FIG. 3, a light source module 300 of the embodiment is similar to the light source module 100 of FIG. 1, and the differences are illustrated as follows. In the embodiment, a first optical layer 320S is a surface structure layer of a penetrating light selection layer 320.

Accordingly, with the configuration of the first optical layer 320S, the penetrating light selection layer 320, and the second optical layer 140, the light source module 300 may still allow the beams L1 emitted at the forward viewing angle and at the small angle by the light-emitting element 110 to travel in a longer transmission path in the cavity of the light source module 300. Therefore, the light source module 300 may also achieve functions similar to the functions of the light source module 100 in FIG. 1, and thereby attaining effects and advantages similar to the effects and advantages of the light source module 100, which is not iterated herein.

FIG. 4 is a schematic cross-sectional view of a light source module according to an embodiment of the disclosure. Referring to FIG. 4, a light source module 400 of the embodiment is similar to the light source module 100 of FIG. 1, and the differences are illustrated as follows. In the embodiment, a second optical layer 430S is a surface structure layer of a penetrating light selection layer 430.

Accordingly, with the configuration of the first optical layer 120, the penetrating light selection layer 430, and the second optical layer 430S, the light source module 400 may still allow the beams L1 radiated at the forward viewing angle and at the small angle by the light-emitting element 110 to travel in a longer transmission path in the cavity of the light source module 400. Therefore, the light source module 400 may also achieve functions similar to the functions of the light source module 100 in FIG. 1, and thereby attaining effects and advantages similar to the effects and advantages of the light source module 100, which is not iterated herein.

Figure 5:
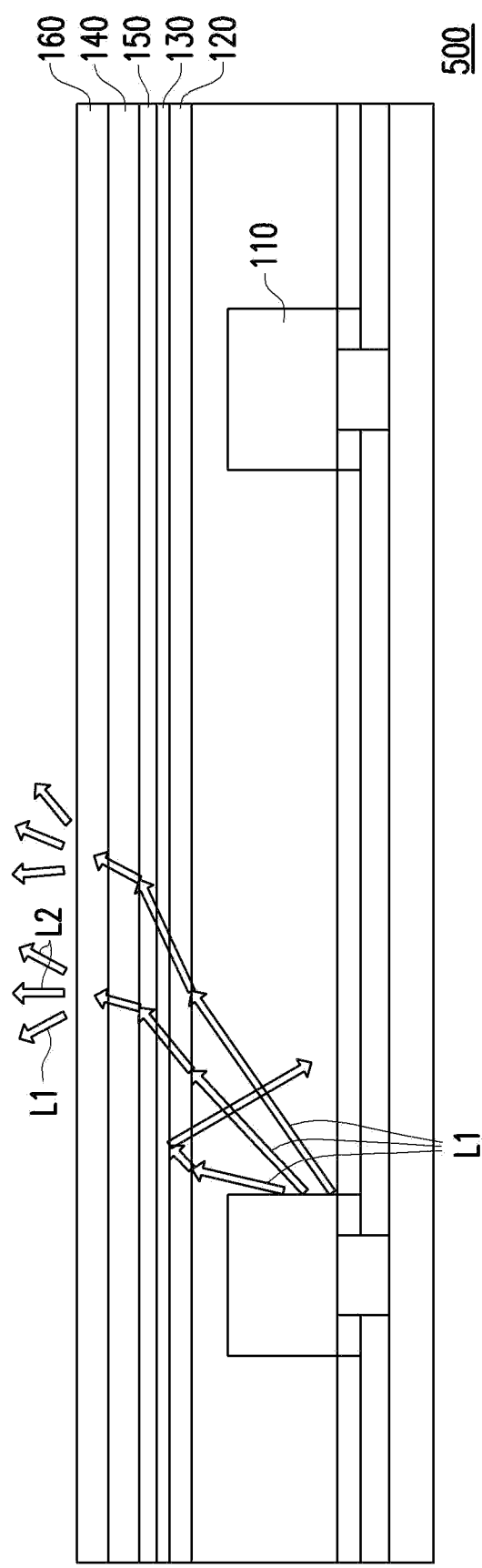
FIG. 5 is a schematic cross-sectional view of yet another light source module according to an embodiment of the disclosure.

FIG. 5 is a schematic cross-sectional view of a light source module according to an embodiment of the disclosure. Referring to FIG. 5, a light source module 500 of the embodiment is similar to the light source module 100 of FIG. 1, and the differences are illustrated as follows. In the embodiment, the second optical layer 140 is disposed between the wavelength conversion layer 160 and the light splitting layer 150, and the light splitting layer 150 is disposed between the second optical layer 140 and the penetrating light selection layer 130.

Accordingly, with the configuration of the first optical layer 120, the penetrating light selection layer 130, and the second optical layer 140, the light source module 500 may still allow the beams L1 emitted at the forward viewing angle and at the small angle by the light-emitting element 110 to travel in a longer transmission path in the cavity of the light source module 500. Therefore, the light source module 500 may also achieve functions similar to the functions of the light source module 100 in FIG. 1, and thereby attaining effects and advantages similar to the effects and advantages of the light source module 100, which is not iterated herein.

Figure 6:
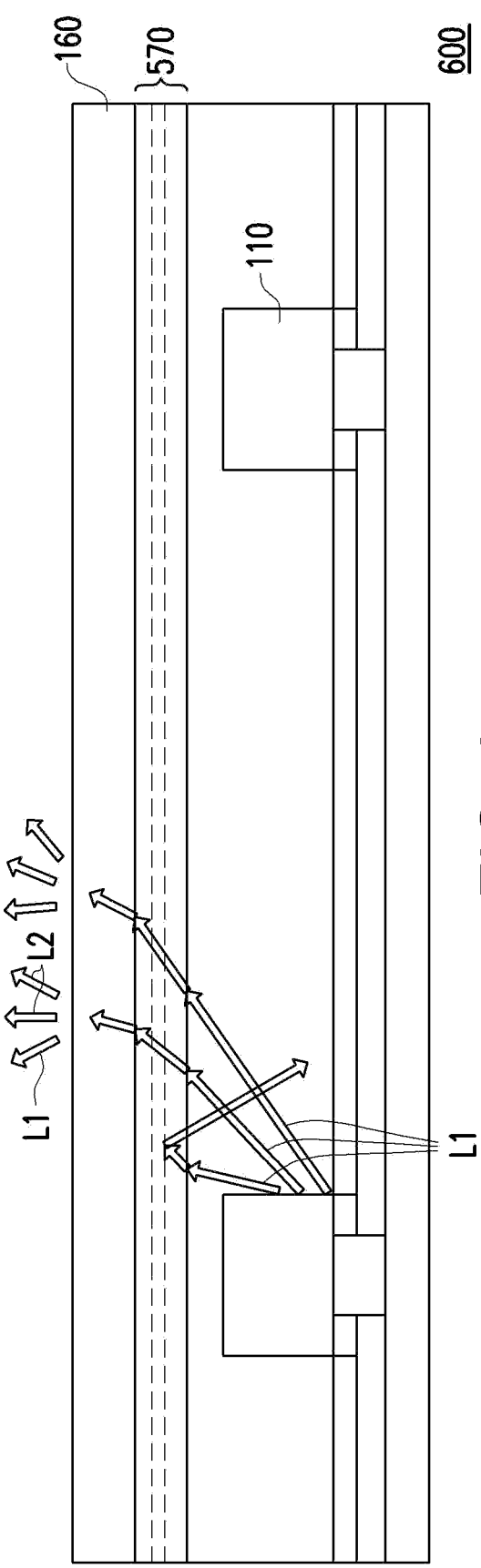
FIG. 6 is a schematic cross-sectional view of still yet another light source module according to an embodiment of the disclosure.

FIG. 6 is a schematic cross-sectional view of a light source module according to an embodiment of the disclosure. Referring to FIG. 6, a light source module 600 of the embodiment is similar to the light source module 100 of FIG. 1, and the differences are illustrated as follows. In the embodiment, the first optical layer 120, the second optical layer 140, the penetrating light selection layer 130, and the light splitting layer 150 (referring to the light source module 100) form an optical film 570. Moreover, the transmittance of the optical film 570 for light with a wavelength ranging from 480 nm to 500 nm is greater than 50%, and the transmittance for light with a wavelength ranging from 430 nm to 460 nm is greater than 90%. In addition, the optical film 570 may reflect light with a wavelength falling outside the first wavelength band. In other words, the optical film 570 is a blue light penetrating bandpass filter and has an all-in-one function of the first optical layer 120, the second optical layer 140, the penetrating light selection layer 130, and the light splitting layer 150.

Accordingly, with the configuration of an optical film, the light source module 600 may allow the beams L1 emitted at the forward viewing angle and at the small angle by the light-emitting element 110 to travel in a longer transmission path in the cavity of the light source module 600. Therefore, the light source module 600 may also achieve functions similar to the functions of the light source module 100 in FIG. 1, and thereby attaining effects and advantages similar to the effects and advantages of the light source module 100, which is not iterated herein.

In summary, the embodiments of the disclosure have at least one of the following advantages or effects. In the embodiments of the disclosure, with the configuration of the first optical layer, the penetrating light selection layer, and the second optical layer, the light source module may allow beams radiated at the forward viewing angle and at the small angle by the light-emitting element to travel in a longer transmission path in the cavity of the light source module. Accordingly, the uniformity of the illumination beam may be improved, and therefore the distance of the light-emitting elements may be increased and the optical distance of the light source module may be reduced, so as to reduce the module thickness and the product cost. Moreover, with the configuration of the light splitting layer, the brightness of the illumination beam of the light source module may be increased.

The foregoing description of the preferred embodiments of the disclosure has been presented for purposes of illustration and description. It is not intended to be exhaustive or to limit the disclosure to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the disclosure and its best mode practical application, thereby to enable persons skilled in the art to understand the disclosure for various embodiments and with various modifications as are suited to the particular use or implementation contemplated. It is intended that the scope of the disclosure be defined by the claims appended hereto and their equivalents in which all terms are meant in their broadest reasonable sense unless otherwise indicated. Therefore, the term "the disclosure", "the present disclosure" or the like does not necessarily limit the claim scope to a specific embodiment, and the reference to particularly preferred exemplary embodiments of the disclosure does not imply a limitation on the disclosure, and no such limitation is to be inferred. The disclosure is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the disclosure. It should be appreciated that variations may be made in the embodiments described by persons skilled in the art without departing from the scope of the present disclosure as defined by the following claims. Moreover, no element and component in the present disclosure is intended to be dedicated to the public regardless of whether the element or component is explicitly recited in the following claims.

What is claimed is:

1. A light source module, comprising:
   at least one light-emitting element for providing a beam, wherein a wavelength of the beam falls within a first wavelength band;
   a first optical layer disposed on a transmission path of the beam, wherein an exit angle of the beam at which the beam exits the first optical layer is greater than an incident angle of the beam at which the beam is incident to the first optical layer;
   a penetrating light selection layer disposed on the transmission path of the beam, wherein the penetrating light selection layer allows light with a wavelength falling within a second wavelength band to pass through, and the penetrating light selection layer has an angle-dependent variable transmittance for light with a wavelength falling within the first wavelength band;
   a second optical layer disposed on the transmission path of the beam, wherein the penetrating light selection layer is disposed between the first optical layer and the second optical layer, and when the beam is incident to the second optical layer, an exit angle of the beam at which the beam exits the second optical layer is less than an incident angle of the beam at which the beam is incident to the second optical layer;
   a light splitting layer disposed on the transmission path of the beam, wherein the light splitting layer allows light with a wavelength falling within the first wavelength band to pass through and reflects light with a wavelength falling within the second wavelength band; and
   a wavelength conversion layer disposed on the transmission path of the beam and configured to convert part of the beam into a converted beam, and a wavelength of the converted beam falls within the second wavelength band.

2. The light source module according to claim 1, wherein in the penetrating light selection layer, a transmittance distribution curve of the light with a wavelength falling within the first wavelength band at an incident angle is formed, the transmittance distribution curve of the light at the incident angle has at least one transmittance peak value, the at least one transmittance peak value corresponds to at least one first incident angle one to one, the at least one first incident angle ranges from 30 degrees to 90 degrees, the first wavelength band is a wavelength band with a wavelength ranging from 380 nm to 500 nm, and the second wavelength band is a wavelength band with a wavelength ranging from 500 nm to 780 nm.

3. The light source module according to claim 2, wherein the penetrating light selection layer comprises transmittance less than 40% for light with a wavelength falling within the first wavelength band and incident in a forward direction.

4. The light source module according to claim 1, wherein the light splitting layer is disposed between the wavelength conversion layer and the second optical layer, and the second optical layer is disposed between the light splitting layer and the penetrating light selection layer.

5. The light source module according to claim 1, wherein the second optical layer is disposed between the wavelength conversion layer and the light splitting layer, and the light splitting layer is disposed between the second optical layer and the penetrating light selection layer.

6. The light source module according to claim 1, wherein the first optical layer and the second optical layer are prism films or a plurality of optical microstructures arranged in an array.

7. The light source module according to claim 6, wherein each of the optical microstructures is polyhedral, and an apex angle of each of the optical microstructures ranges from 60 degrees to 150 degrees.

8. The light source module according to claim 1, wherein at least one of the first optical layer and the second optical layer is a surface structure layer of the penetrating light selection layer.

9. The light source module according to claim 1, wherein the first optical layer, the second optical layer, and the penetrating light selection layer are different film layers separated from each other.

10. The light source module according to claim 1, wherein the first optical layer, the second optical layer, the penetrating light selection layer, and the light splitting layer form an optical film, and the optical film comprises a transmittance greater than 50% for light with a wavelength ranging from 480 nm to 500 nm and a transmittance greater than 90% for light with a wavelength ranging from 430 nm to 460 nm.

* * * * *